United States Patent [19]

Bobeck

[11] 4,143,420

[45] Mar. 6, 1979

[54] CONDUCTOR-ACCESS, MAGNETIC BUBBLE MEMORY

[75] Inventor: Andrew H. Bobeck, Chatham, N.J.

[73] Assignee: Bell Telephone Laboratories Incorporated, Murray Hill, N.J.

[21] Appl. No.: 857,925

[22] Filed: Dec. 6, 1977

[51] Int. Cl.² ............................................. G11C 19/08
[52] U.S. Cl. ........................................ 365/19; 365/36; 365/37; 365/41
[58] Field of Search .................... 365/8, 19, 20, 36, 37

[56] References Cited

U.S. PATENT DOCUMENTS 3,967,002  6/1976  Almasi et al. .......................... 365/37

OTHER PUBLICATIONS

AIP Conference Proceedings on Magnetism & Magnetic Materials, No. 24, Dec. 3-6, 1974, pp. 550-551.

Primary Examiner—James W. Moffitt
Attorney, Agent, or Firm—Herbert M. Shapiro

[57] ABSTRACT

A conductor-access, magnetic bubble memory is realized with a single metallization level for propagation. The familiar undulating or serpentine conductor pattern used for moving bubbles is modified to allow a simple and easily realizable, low power drive arrangement where currents flow parallel to the bubble paths.

9 Claims, 10 Drawing Figures

CONDUCTOR-ACCESS, MAGNETIC BUBBLE MEMORY

FIELD OF THE INVENTION

This invention relates to conductor-access, magnetic bubble memories.

CROSS REFERENCE TO RELATED APPLICATIONS

The present application is related to patent applications, Ser. Nos. 857,919, 857,920, and 857,921, filed Dec. 6, 1977 for A. H. Bobeck.

BACKGROUND OF THE INVENTION

Magnetic bubble memories are now well known in the art. Two well understood modes of operating bubble memories are the conductor-access mode and the field-access mode. A. H. Bobeck et al, U.S. Pat. No. 3,460,116 issued Aug. 5, 1969, describes a basic three-phase, conductor-access mode for operating bubble memories. A. H. Bobeck, U.S. Pat. No. 3,534,347, issued Oct. 13, 1970, described the basic field-access mode for operating bubble memories. We are concerned primarily with the conductor-access mode herein.

The basic conductor-access mode bubble memory is hard to realize commercially. The primary reason for this is that three-phase operation is required to impart unidirectional movement to bubbles and thus a three-phase propagation drive arrangement is required. The basic conductor-access arrangement thus comprised three separate levels of metallization each having a serpentine electrical conductor pattern. The patterns are offset from one another and pulsed in a three-phase manner to realize proper bubble movement. Such circuits are characterized by the following problems: Firstly, since current is impressed from the end of a long conductor; high power consumption is the rule. Further, although the conductor levels are separated by insulating layers, the resulting circuits are subject to short circuits which are fatal. Moreover, nonuniformities in the conductor pattern result in current nonuniformities which cause a loss in operating margins. Also, multilevel conductor patterns are costly to realize.

R. F. Fischer, U.S. Pat. No. 3,564,518, issued Feb. 16, 1971, discloses the use of structured-in rest positions operative as a phase of a multiphase conductor-access arrangement. The rest positions are defined by patterns of permalloy dots a pair of which is offset from each conductor of a two-phase conductor pattern. Specifically, each of two conductors of the pattern is pulsed in sequence to move a bubble, in each instance, to a position offset from a rest position. At the termination of a current pulse, the bubble offsets to the associated pair of permalloy dots thus ensuring unidirectional movement of the bubble. The use of the permalloy pattern reduces the requisite number of metallization levels to two and reduces power requirements but adds a permalloy level.

U.S. Pat. Nos. 3,693,177 and 3,678,479 issued Sept. 19, 1972 and July 18, 1972, respectively, disclose magnetic bubble memories which even further reduce the number of metallization levels to one. Here again the use of offset rest positions for bubbles is provided for to reduce the complexity of the conductor implementation. In the memories of these patents, two propagation phases are realized with a single metallization by applying bipolar pulses to the metallization. The underlying bubble layer itself is formed into undulating strips to define the rest positions and to provide interpath decoupling.

The problem with the conductor-access arrangements with single-metallization-level implementations is that they are still high power devices, intolerant of faults, and demanding on photolithographic processing.

BRIEF DESCRIPTION OF THE INVENTION

The solution of the above problem rests with the realization that the undulating conductor geometry useful for propagating bubbles along a single path can be organized with similar patterns for adjacent paths so that the patterns touch at the maximum amplitude positions. The resulting overall geometry permits relatively low power to be achieved for overall current flow parallel to the paths of bubble movement and allows relatively high packing densities and fault tolerant circuits to be realized.

In one specific embodiment, the conductor pattern is formed by an apertured metallized layer cooperating with offset ion-implanted rest positions for bubbles. The resulting arrangement is similar to that disclosed in copending application Ser. No. 857,921 filed on even date herewith for A. H. Bobeck where the apertures locally vary an otherwise overall uniform current flow much as permalloy elements in a field-access type memory vary an otherwise uniform magnetic field. In the present case, the rest positions associated with an individual aperture are offset from one another laterally with respect to the paths of bubble propagation and are centered on the upstream and downstream edges of that aperture. Current flow in the conductor pattern is parallel to the paths of bubble movement.

DETAILED DESCRIPTION

Figure 1:
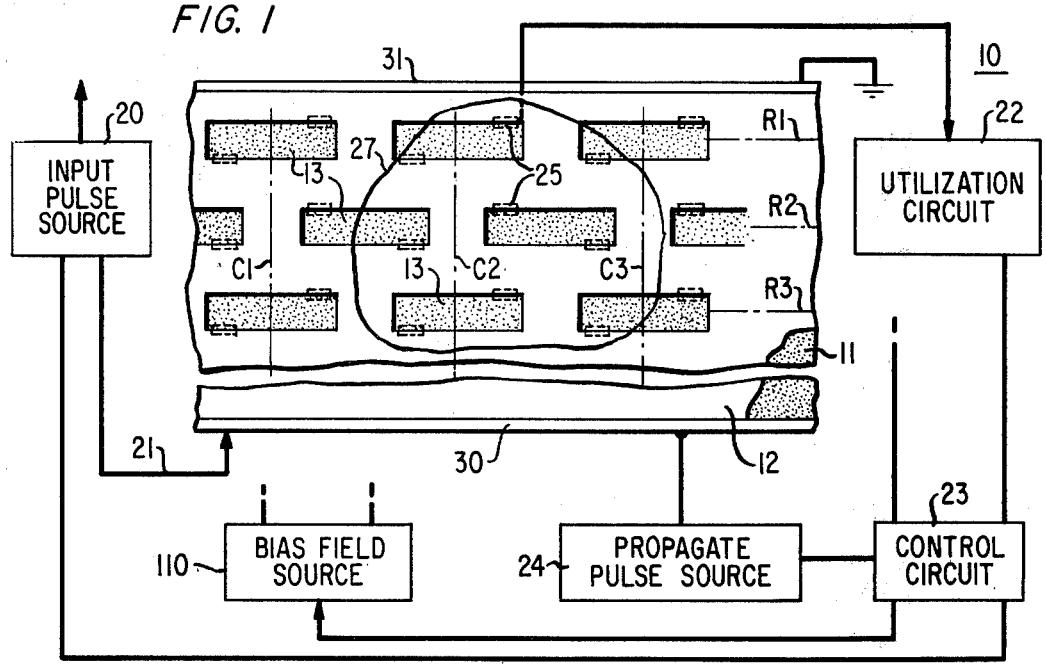
FIG. 1 is a schematic representation of a magnetic bubble memory in accordance with this invention.

FIG. 1 shows a magnetic bubble memory 10 including a layer 11 of a material in which magnetic bubbles can be moved. An electrically-conducting film 12, illustratively of aluminum and copper, is formed on the surface of layer 11. Apertures 13 are formed in film 12 exposing portions of layer 11 therebeneath.

The apertures are organized into rows R1, R2, R3... oriented from left to right as viewed in the Fig. Each row can be seen to be offset a distance of about one half an aperture from the adjacent rows. Yet, generally, the aperture can be seen to be arranged in columns C1, C2, C3... Bubble propagation occurs along these columns from bottom to top as viewed in the Fig.

An input pulse source is shown represented by block 20 in the Fig. and, as indicated by arrow 21, is operative in a well understood manner to introduce bubbles to the paths defined by the columns. A detector arrangement (not shown) is operative at the top of the layer 11 as viewed to apply signals to a utilization circuit represented by block 22 under the control of a control circuit 23. A propagate pulse source is represented by block 24. The memory, thus, can be seen to be organized to move upwards, as viewed, bubble patterns introduced by source 20 for generating signals to be applied to circuit 22.

The propagation arrangement for so moving bubble patterns comprises several elements including film 12 along with the apertures 13. Rest positions for bubbles are also provided illustratively by ion-implanted regions in layer 11. These regions are indicated at 25 in FIG. 1 and shown more clearly in the enlarged views 27 of FIGS. 2 through 4. The propagation arrangement also comprises contact lands 30 and 31 for the provision of the requisite currents in a manner to dissipate relatively little power.

The ion-implanted regions are, illustratively, regions which bubbles prefer to occupy. Thus, they are rest (low-energy) positions and are disposed to offset a bubble from a position to which it is moved in response to a current pulse. Current pulses are applied to land 30 by source 24. The pulse form can be seen in FIG. 5 to be bipolar including first and second pulses 40 and 41 of opposite polarity. The pulses are shown separated by zero levels indicated at time TA and TB in FIG. 5 to allow bubbles time to offset to next subsequent rest positions. In practice, in the 1 to 3 megacycle range of operation, times TA and TB have been reduced to zero duration. It may be appreciated that the first and second pulses are operative to initiate first and second phases of a propagate sequence. The offset due to ion-implant region in each instance completes the phase of operation.

Figure 2:
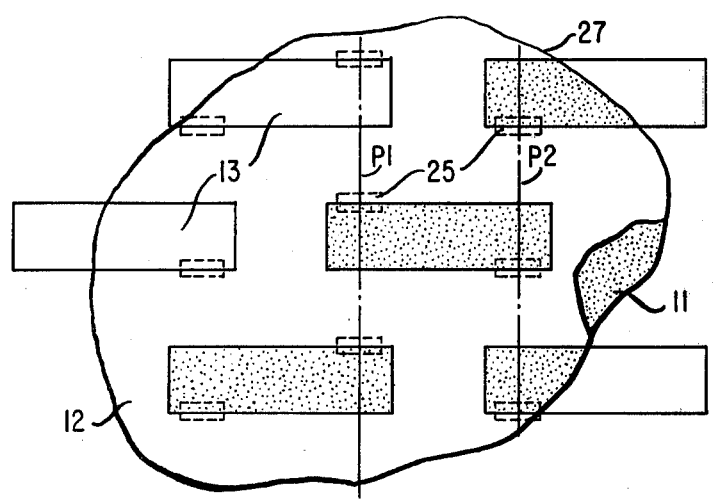
FIGS. 2 through 4 are enlarged top views of portions of the memory of FIG. 1.
Figure 3:
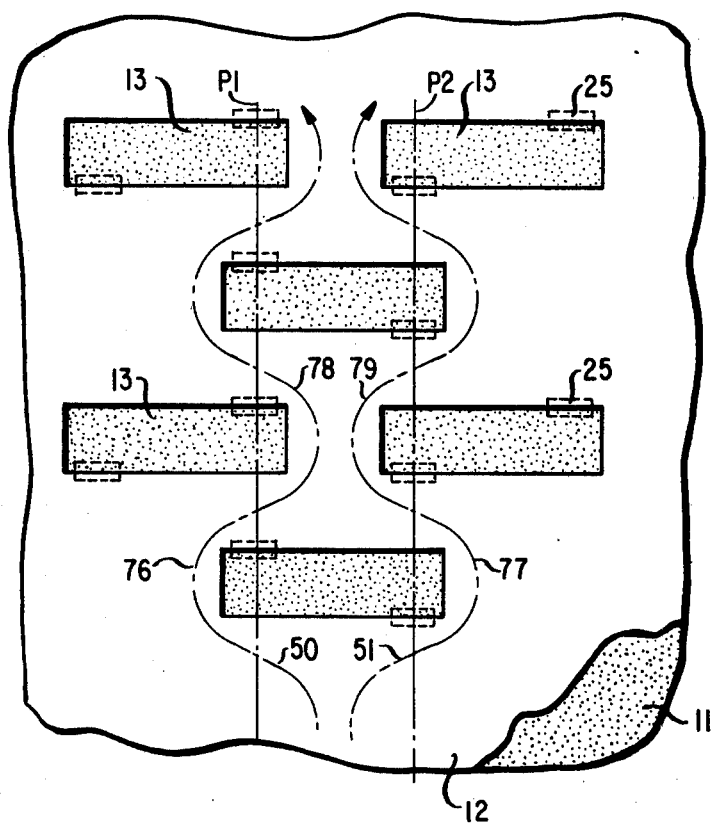
Figure 4:
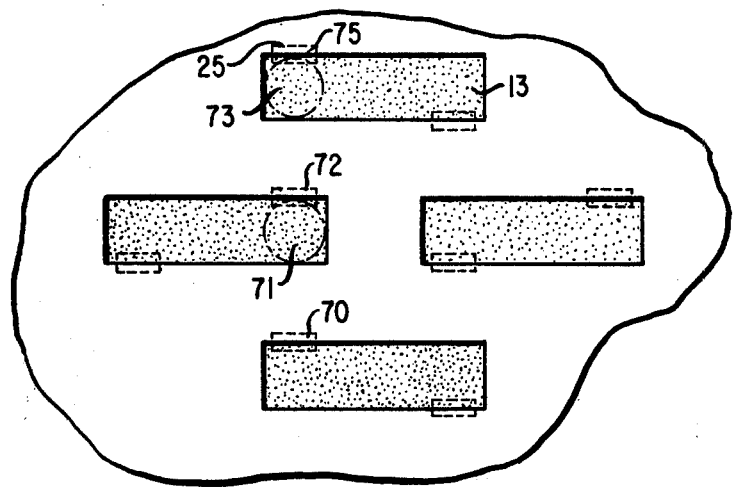

A glance at FIGS. 2 and 3 shows that the ion-implanted regions associated with the column of apertures align with one another along what we will designate as paths herein. Thus, as shown in FIGS. 2 and 3, a column of ion-implanted regions defines path P1 and an adjacent column defines path P2. These are the paths along which bubbles move during propagation.

Figure 5:
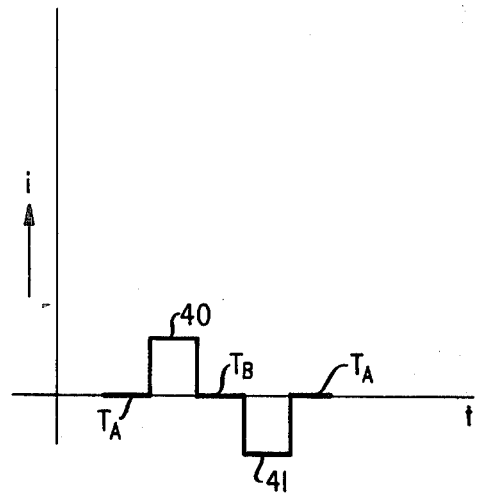
FIG. 5 is a pulse diagram of pulses applied to the memory of FIGS. 1-5.

Propagation actually occurs in response to the pulses of FIG. 5 as mentioned hereinbefore. We will adopt the convention that positive pulse 40 in FIG. 5 results in current flowing in layer 12 in a direction indicated by curved arrows 50 and 51 in FIG. 3. Note that the arrows enclose a sequence of hourglass-shaped areas which we will have reason to refer to hereinafter. Consider first, for example, a bubble at rest in position 70 of FIG. 4. Pulse 40 is operative, in accordance with the familiar right hand rule, to move the bubble to position 71. At time TB in FIG. 5, pulse 40 terminates and the bubble moves to the next subsequent rest position at 72. A next subsequent pulse 41 of FIG. 5 is operative to move the bubble to position 73. At time TA, pulse 41 terminates and the bubble is offset to the next consecutive rest position 75. One cycle of operation is now complete. It should be clear that multiple paths are defined in film 12 by apertures 13 and rest positions 25 for simultaneous operation as described.

Arrows 50 and 51 of FIG. 3 were said to represent the paths of current flow in response to pulse 40. Of course, the same path is followed for opposite polarity current flow in response to pulse 41. Thus, the currents are contoured into (hour-glass or) sinusoidal current paths by the apertures 13. It is clear that like-poled maximum amplitude positions of adjacent paths, as indicated, for example, at 76 and 77 in FIG. 3, are out of phase with one another. In fact, at 78 and 79 in FIG. 3 these positions actually correspond to a single conductor segment. In other words, the conductor for adjacent bubble paths are actually short circuited to one another. This was one likely failure mode for prior art structures. Yet the organization herein is totally tolerant of such "short circuits". The reason for such tolerance and the resulting advantage, as for example achieving higher packing densities and lowering power requirements, can be seen from a discussion of FIGS. 6 through 9.

Figure 6:
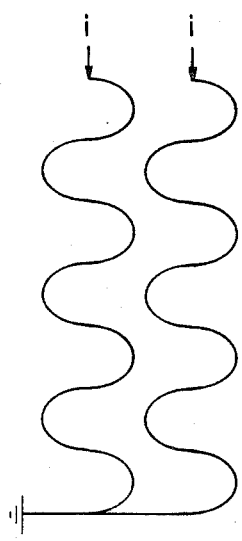
FIGS. 6 through 9 are schematic views representative of the structural evolution of the propagation arrangement of the memory of FIGS. 1-4.

FIG. 6 shows a typical prior art conductor geometry for magnetic bubble propagation. It is to be noted that the conductors have the same period and are in phase. One reason for the in-phase positioning is to avoid contact between adjacent conductors. Contact caused short circuits which resulted in device failure because the paths for currents were then not defined.

Figure 7:
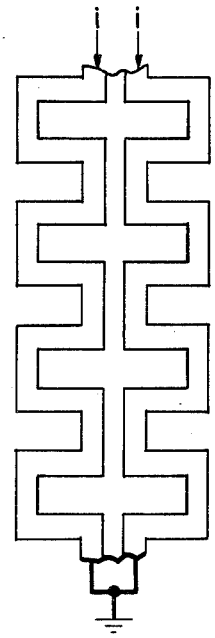
Figure 8:
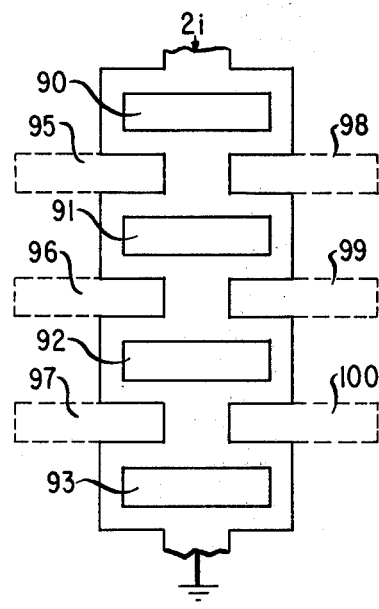

FIG. 7 shows an out-of-phase positioning of adjacent electrical conductors in accordance with an aspect of this invention. Note that a reduction of the separation between the two conductors of FIG. 7 (so that they touch) along with a reduction in size of the touching portions of the conductors leads to the single pattern of FIG. 8. In the arrangement of FIG. 8, twice the former current (of FIG. 6) is impressed as indicated in the FIG. The structure of FIG. 8 can be understood as including a number of apertures 90, 91, 92 and 93 in a conductor film. If also we dot in apertures for adjacent conductor patterns, as indicated by dotted blocks 95, 96 and 97 and 98, 99 and 100, a greater apertured film geometry of FIG. 9 appears.

Figure 9:
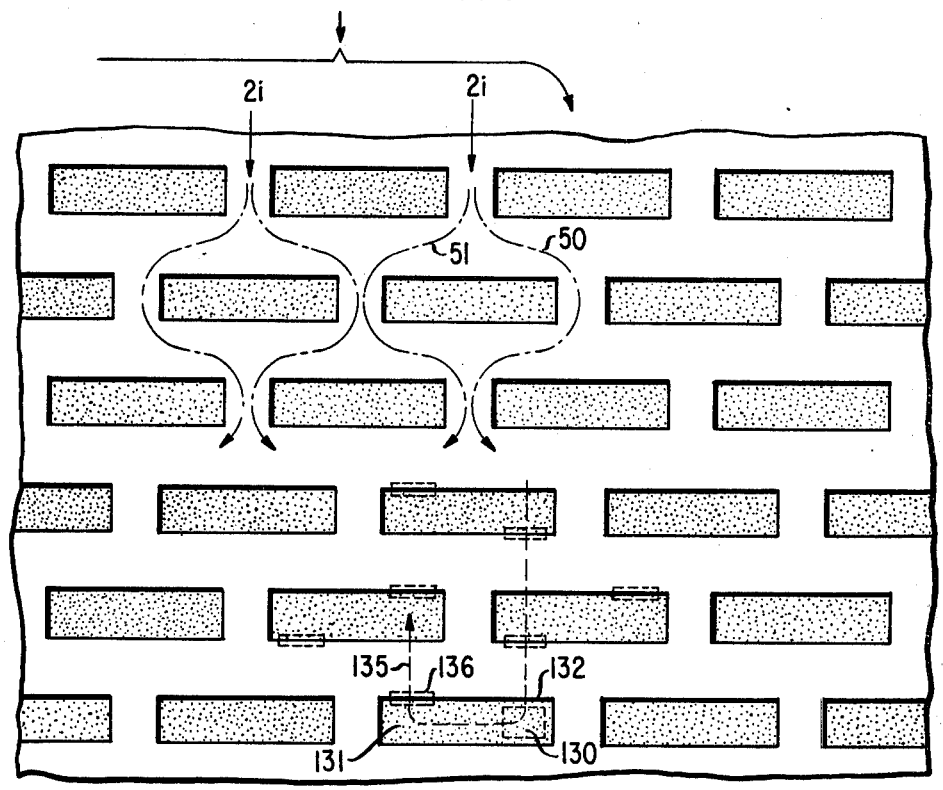

The geometry of FIG. 9 can be seen to correspond to that of FIGS. 1-4 if the ion-implanted regions were added. Thus, it is clear that higher packing densities are realized if only by reducing the separation between bubble paths or channels. Of course, it follows that the per-bit power requirements are reduced too.

A bias source represented by block 110 in FIG. 1 maintains the bubbles at a nominal operating diameter. That diameter is about equal to the width of the apertures in say FIG. 4.

In one typical embodiment an epitaxial bubble layer of YSmCaGe, 1.8 microns thick, exhibited a nominal bubble diameter of 1.7 microns at a bias field of 240 Oersteds. An aluminum-copper film was formed on the layer to a thickness of 3000 Angstrom units. Apertures 1.5 microns wide and 9 microns long were formed on 12 micron centers and in staggered columns spaced on 3 micron centers leading to a packing density of $3 \times 10^6$ bits/cm$^2$. Ion-implanted regions 1.5 microns by 3.0 microns were formed by exposure to Neon at 100 kev to obtain an implant of $7.5 \times 10^{13}$ ions per square centimeter. Current pulses of 4 milliamperes per cell were applied for 0.5 microsecond, with no zero level separation, to provide operating speeds of 1 megahertz. Operation over a bias range of 10 Oersteds and over a drive pulse range of 4 to 6 milliamperes was achieved. The minimum per cell power was 17.6 microwatts.

The rest position, of course, can be defined by implementation other than ion implantation. For example, permalloy dots, permanent magnet features, or mesas or grooves in the bubble layer or out-of-phase permalloy elements also are feasible alternatives. Further, the geometries of the apertures and the rest positions need not be rectangular as shown. Regions 25 in FIGS. 1-4 may be taken to represent any rest position regardless of the manner of implementation.

Figure 10:
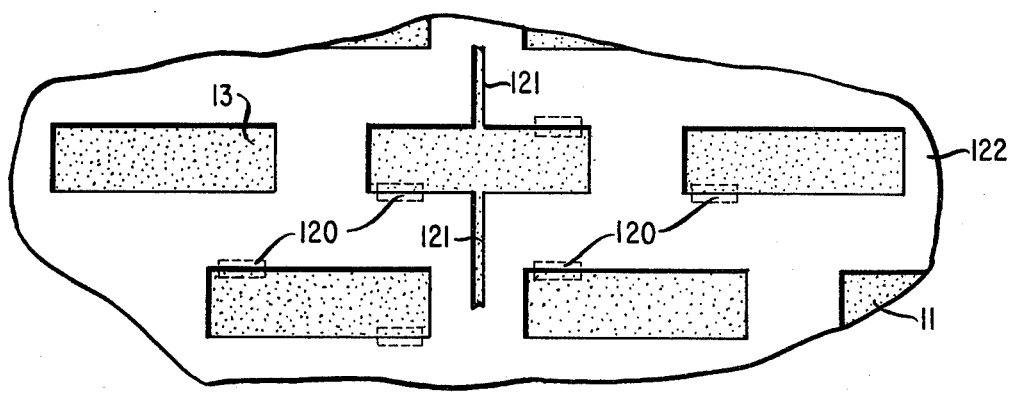
FIG. 10 is a schematic top view of an alternative propagation arrangement in accordance with this invention.

It is possible to operate a memory, in accordance with FIG. 1, in sectors. That is to say, only portions of the memory need be operated at a time. FIG. 10 shows a portion of such a memory where apertures 120 are interconnected by apertures 121 in a conductor film 122. A separate current supply is provided for each sector which is to be operated separately. Such operation in sectors is useful for memories in which some bubble paths are formed to recirculate bubbles in closed loops as is well understood. One turn geometry for achieving such closed-loop operation is shown in FIG. 9 where ion-implanted region 130 is aligned with the aperture 131 rather than with the edge 132 of that aperture. Moreover, the ion-implanted region is relatively large. A bubble moves clockwise along path 135 to ion-implanted region 136. The last-mentioned move occurs in a manner consistent with that described in the above-mentioned copending application.

What has been described is considered merely illustrative of the principle of this invention. Therefore, various modifications of the invention can be devised by thosed skilled in the art within the spirit and scope thereof as encompassed by the following claims.

What is claimed is:

1. A magnetic memory comprising a layer of material in which magnetic bubbles can be moved and a propagation arrangement for moving bubbles along a plurality of paths in said layer, said propagation arrangement comprising first and second adjacent electrical conductors arranged along parallel paths, said conductors having undulating geometries with periodic positions of maximum amplitude and like periods and being in electrical contact with one another at said positions of maximum amplitude, means for applying to said conductors first and second currents of first and second polarities for moving bubbles to first and second positions along said paths, and means for providing in said layer a rest position for a bubble downstream of each of said first and second positions.

2. A magnetic memory in accordance with claim 1 wherein said first and second adjacent electrical conductors are formed in a single film of electrically conducting material, said film having staggered columns of apertures operative to contour currents impressed therealong.

3. A magnetic memory in accordance with claim 2 wherein said rest positions comprise ion-implanted regions in said layer.

4. A magnetic memory in accordance with claim 2 in which said rest positions are aligned in columns.

5. A magnetic memory in accordance with claim 2 wherein said rest positions comprise recesses in said layer.

6. A magnetic memory comprising a layer of material (11) in which magnetic bubbles can be moved and a propagation arrangement (12, 13, 25, 30, 31, 24) for moving bubbles along a plurality of paths in the layer from input to output ends,

CHARACTERIZED IN THAT the propagation arrangement comprising a film (12) of electrically-conducting material coupled to the layer, the film including a plurality of sets of apertures (13) for defining the paths, and means (12, 13, 25, 30, 31) responsive to first and second signals (from 24) of opposite polarity for establishing in the film uniform current flow in first and second directions parallel to the paths, the apertures being operative to contour current flow into patterns of localized currents for moving bubbles to first and second positions in the paths, and means (25) for providing rest positions for bubbles along the paths, the last-mentioned means comprising a rest position offset downstream along the path from each of the first and second positions.

7. A magnetic bubble memory comprising a layer of magnetic material in which magnetic bubbles can be moved, and means for providing rest positions for bubbles along paths of propagation in said layer, said memory being characterized by signal-responsive means for providing substantially uniform overall current flow in first and second directions along said paths in a plane coupled to said layer, and means for causing a pattern of localized perturbation in said current flow for moving bubbles to positions offset from said rest positions.

8. A magnetic bubble memory in accordance with claim 7 wherein said signal-responsive means includes a film of electrically-conducting material adjacent said layer and said means for causing a pattern of localized perturbation comprises a pattern of apertures in said film organized in rows where the apertures of one row are offset from the apertures of the next preceding and next subsequent rows and where each aperture has a leading and trailing edge.

9. A magnetic bubble memory in accordance with claim 8 wherein said means for providing rest positions comprises ion-implanted regions in said layer, said regions being arranged so that a pair thereof correspond to the leading and trailing edge of an associated aperture, the regions associated with a single aperture being offset from one another and lying in adjacent ones of said paths.

* * * * *